(12) United States Patent
Okamura et al.

(10) Patent No.: US 8,451,565 B1
(45) Date of Patent: May 28, 2013

(54) MAGNETORESISTIVE HEAD HAVING PERPENDICULARLY OFFSET ANISOTROPY FILMS AND A HARD DISK DRIVE USING THE SAME

(75) Inventors: Susumu Okamura, Odawara (JP); Takahiro Ibusuki, Tokyo (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/301,596

(22) Filed: Nov. 21, 2011

(51) Int. Cl.
G11B 5/33 (2006.01)

(52) U.S. Cl.
USPC .................................. 360/313; 360/324.12

(58) Field of Classification Search
USPC .............................. 360/313, 324.12
See application file for complete search history.

(56) References Cited

U.S. PATENT DOCUMENTS

| | | | |
|---|---|---|---|
| 6,515,838 B1 | 2/2003 | Gill | |
| 7,283,337 B2 | 10/2007 | Sakai et al. | |
| 7,804,668 B2 * | 9/2010 | Zhou et al. | 360/324.12 |
| 2001/0003022 A1 | 6/2001 | Kakihara | |
| 2003/0030947 A1 | 2/2003 | Ooshima | |
| 2003/0048585 A1 * | 3/2003 | Gill | 360/324.12 |
| 2005/0213265 A1 | 9/2005 | Gill | |
| 2007/0030603 A1 | 2/2007 | Sato et al. | |
| 2008/0117552 A1 * | 5/2008 | Zhou et al. | 360/319 |
| 2008/0273274 A1 | 11/2008 | Kojima et al. | |
| 2009/0103215 A1 * | 4/2009 | Freitag et al. | 360/324.12 |

OTHER PUBLICATIONS

Zheng et al., "3-D FEM micromagnetic modeling of spin-valve sensors," IEEE Transactions on Magnetics, vol. 36, No. 5, Sep. 2000, pp. 3158-3160, abstract only.

\* cited by examiner

*Primary Examiner* — Hoa T Nguyen
*Assistant Examiner* — Carlos E Garcia
(74) *Attorney, Agent, or Firm* — Zilka-Kotab, PC

(57) ABSTRACT

In one embodiment, a magnetic head includes a lower shield layer, a sensor stack positioned above the lower shield layer, the sensor stack including a free layer, a layered hard bias magnet positioned above the lower shield layer and on both sides of the sensor stack in a track width direction, and an upper shield layer positioned above the hard bias magnet and the sensor stack. The hard bias magnet includes a perpendicular anisotropy film positioned above the lower shield layer and aligned with both sides of the sensor stack in the track width direction, wherein the perpendicular anisotropy film directs magnetic fields in a direction perpendicular to planes of formation thereof, and an in-plane anisotropy film positioned above the perpendicular anisotropy film, wherein the in-plane anisotropy film directs magnetic fields in a direction of planes of formation thereof.

20 Claims, 5 Drawing Sheets

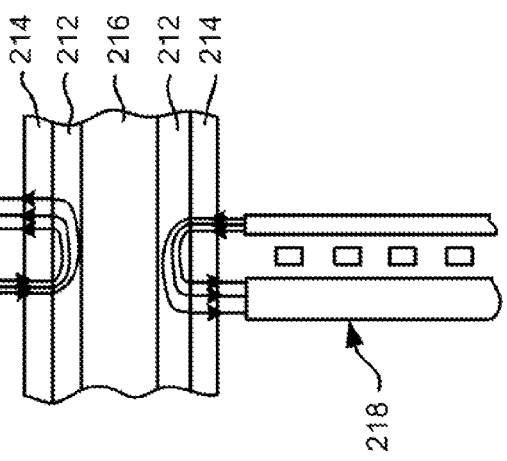
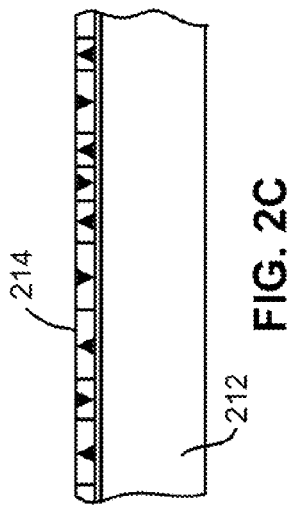
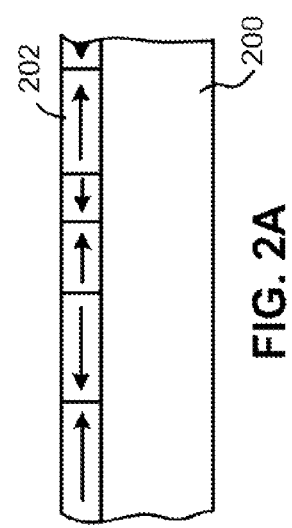
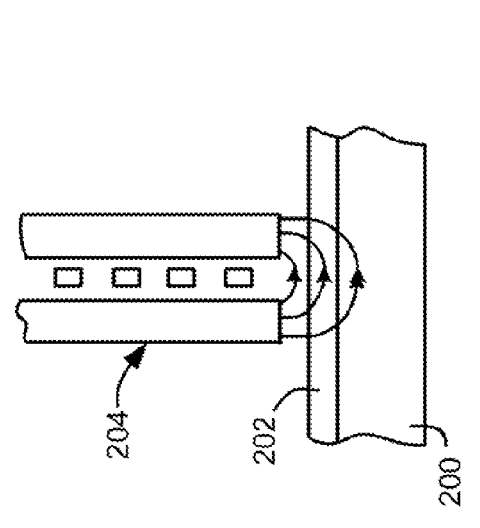

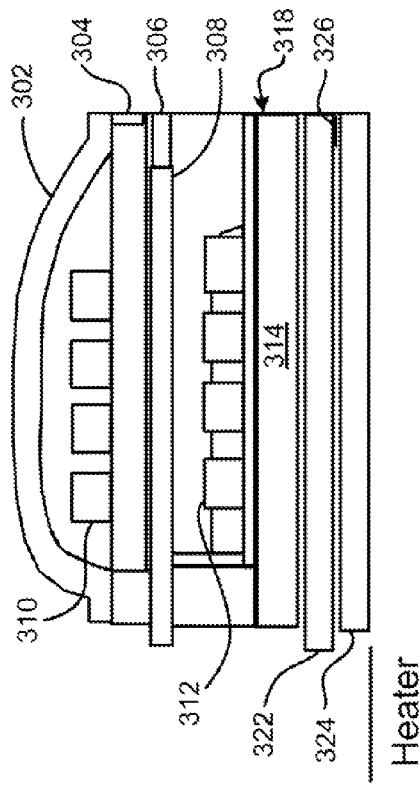
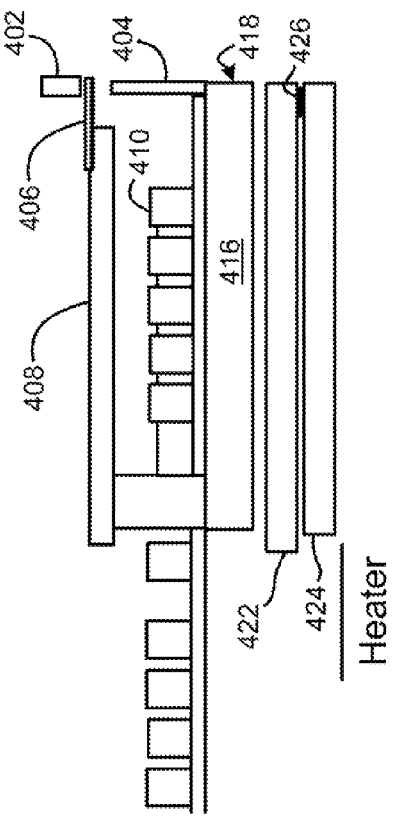
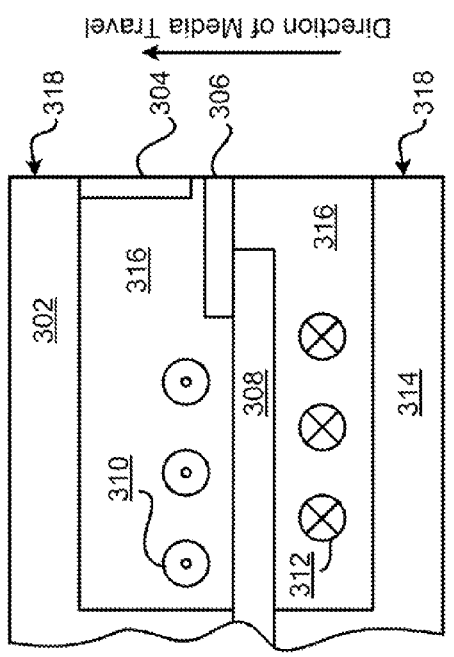
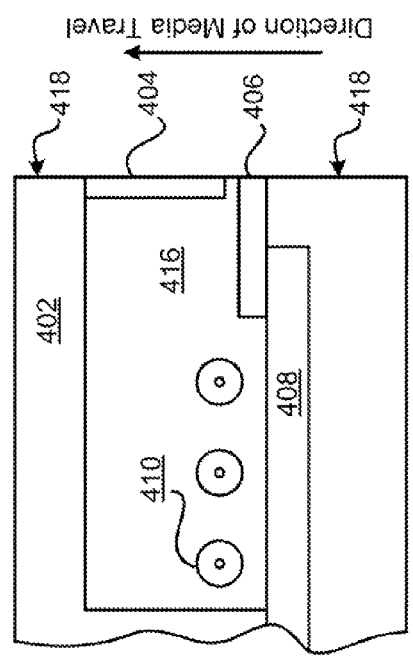

MAGNETORESISTIVE HEAD HAVING PERPENDICULARLY OFFSET ANISOTROPY FILMS AND A HARD DISK DRIVE USING THE SAME

FIELD OF THE INVENTION

The present invention relates to magnetic disk drives, and more particularly, to a magnetic head including a layered magnetic domain control film comprising a perpendicular anisotropy film and an in-plane anisotropy film.

BACKGROUND

The heart of a computer is a magnetic hard disk drive (HDD) which typically includes a rotating magnetic disk, a slider that has read and write magnetoresistive heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

These magnetoresistive heads typically comprise: a ferromagnetic free layer in which the magnetization angle is altered by an external magnetic field (referred to below as a free layer), and a ferromagnetic layer which is magnetically fixed in one direction by an antiferromagnetic layer and is stable with respect to external magnetic fields (referred to below as a fixed layer). Such a suitable magnetic field is usually applied using magnetic domain control films disposed on either side of the free layer, such that the initial magnetization angle of the free layer is parallel to the ABS and lies at 90° with respect to the fixed layer.

Recorded information is generally reproduced by utilizing the difference in resistance produced due to changes in the magnetization angle of the free layer and changes in the relative angle between the fixed layer and the free layer. This phenomenon is believed to be caused by the synthesized magnetic field comprising the magnetic domain control film and the leakage magnetic field produced by the medium. If the magnetic field of the magnetic domain control layer applied to the free layer is too intense, a relative angle between the fixed layer and the free layer is not readily achieved, and the output drops. On the other hand, if the field is too weak, the absolute value of asymmetry and variations increase because of the effects of the static magnetic field produced by the fixed layer, the effects of the shape anisotropy magnetic field, etc., thus causing reading errors. Furthermore, the free layer may be endowed with multiple magnetic domains, which can cause Barkhausen Noise. In other words, it is necessary to apply a suitable magnetic field to the free layer in order to properly use the magnetoresistive head.

Therefore, the ability to provide a magnetic domain control film which makes it possible to apply a more stable magnetic field to the free layer than is conventionally achieved would be very advantageous.

SUMMARY

In one embodiment, a magnetic head includes a lower shield layer, a sensor stack positioned above the lower shield layer, the sensor stack including a free layer, a layered hard bias magnet positioned above the lower shield layer and on both sides of the sensor stack in a track width direction, and an upper shield layer positioned above the hard bias magnet and the sensor stack. The hard bias magnet includes a perpendicular anisotropy film positioned above the lower shield layer and aligned with both sides of the sensor stack in the track width direction, wherein the perpendicular anisotropy film directs magnetic fields in a direction perpendicular to planes of formation thereof, and an in-plane anisotropy film positioned above the perpendicular anisotropy film, wherein the in-plane anisotropy film directs magnetic fields in a direction of planes of formation thereof.

In another embodiment, a magnetic head includes a lower shield layer, a current perpendicular-to-plane (CPP) sensor stack positioned above the lower shield layer, the sensor stack including a free layer, a layered hard bias magnet positioned above the lower shield layer and on both sides of the sensor stack in a track width direction, and an upper shield layer positioned above the hard bias magnet and the sensor stack, wherein a thickness ratio, defined as a thickness of the perpendicular anisotropy film divided by a thickness of the in-plane anisotropy film expressed in percentage, is between about 20% and about 40%, and wherein an anisotropy of the in-plane anisotropy film is less than an anisotropy of the perpendicular anisotropy film. The hard bias magnet includes a perpendicular anisotropy film positioned above the lower shield layer and aligned with both sides of the sensor stack in the track width direction, wherein the perpendicular anisotropy film directs magnetic fields in a direction perpendicular to planes of formation thereof, and an in-plane anisotropy film positioned above the perpendicular anisotropy film, wherein the in-plane anisotropy film directs magnetic fields in a direction of planes of formation thereof.

In yet another embodiment, a method includes forming a lower shield layer, forming a sensor stack above the lower shield layer, the sensor stack including a free layer, forming a layered hard bias magnet above the lower shield layer and on both sides of the free layer in a track width direction, wherein a portion of the layered hard bias magnet toward the free layer has perpendicular anisotropy in that it directs magnetic fields in a direction perpendicular to planes of formation thereof, and forming an upper shield layer above the hard bias magnet and the sensor stack.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

Figure 1:
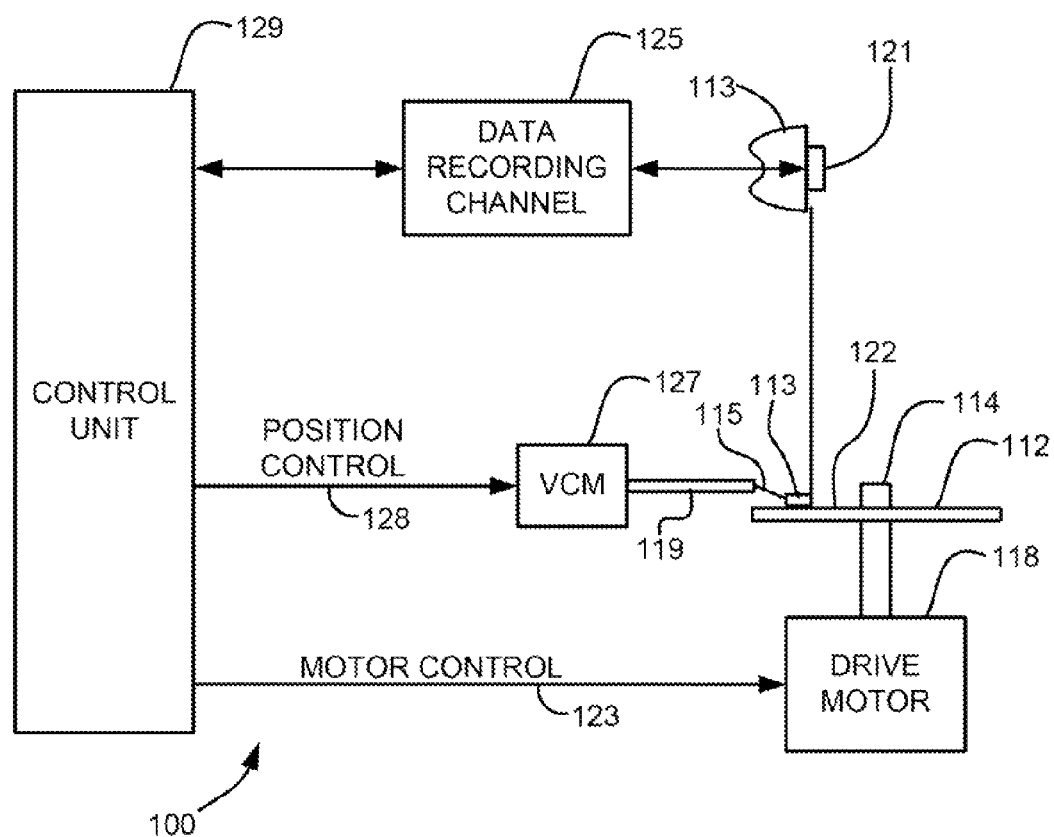
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic head includes a lower shield layer, a sensor stack positioned above the lower shield layer, the sensor stack including a free layer, a layered hard bias magnet positioned above the lower shield layer and on both sides of the sensor stack in a track width direction, and an upper shield layer positioned above the hard bias magnet and the sensor stack. The hard bias magnet includes a perpendicular anisotropy film positioned above the lower shield layer and aligned with both sides of the sensor stack in the track width direction, wherein the perpendicular anisotropy film directs magnetic fields in a direction perpendicular to planes of formation thereof, and an in-plane anisotropy film positioned above the perpendicular anisotropy film, wherein the in-plane anisotropy film directs magnetic fields in a direction of planes of formation thereof.

In another general embodiment, a magnetic head includes a lower shield layer, a current perpendicular-to-plane (CPP) sensor stack positioned above the lower shield layer, the sensor stack including a free layer, a layered hard bias magnet positioned above the lower shield layer and on both sides of the sensor stack in a track width direction, and an upper shield layer positioned above the hard bias magnet and the sensor stack, wherein a thickness ratio, defined as a thickness of the perpendicular anisotropy film divided by a thickness of the in-plane anisotropy film expressed in percentage, is between about 20% and about 40%, and wherein an anisotropy of the in-plane anisotropy film is less than an anisotropy of the perpendicular anisotropy film. The hard bias magnet includes a perpendicular anisotropy film positioned above the lower shield layer and aligned with both sides of the sensor stack in the track width direction, wherein the perpendicular anisotropy film directs magnetic fields in a direction perpendicular to planes of formation thereof, and an in-plane anisotropy film positioned above the perpendicular anisotropy film, wherein the in-plane anisotropy film directs magnetic fields in a direction of planes of formation thereof.

In yet another general embodiment, a method includes forming a lower shield layer, forming a sensor stack above the lower shield layer, the sensor stack including a free layer, forming a layered hard bias magnet above the lower shield layer and on both sides of the free layer in a track width direction, wherein a portion of the layered hard bias magnet toward the free layer has perpendicular anisotropy in that it directs magnetic fields in a direction perpendicular to planes of formation thereof, and forming an upper shield layer above the hard bias magnet and the sensor stack.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by control unit 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

In an attempt to achieve a more stable magnetic field, according to one embodiment, the resolution of the magnetic head may be increased as the recording density increases. An effective way of increasing the resolution includes narrowing the shield-to-shield gap (Gs) of the magnetic head, according to one embodiment.

However, while narrowing the Gs, it is preferable to make the magnetic domain control layer thinner at the same time.

Without wishing to be bound by any one theory, this is believed to cause an amount of magnetization of the magnetic domain control layer to reduce so that a suitable magnetic field can no longer be applied with a narrow Gs magnetic head. Meanwhile, anytime there is a reduction in a thickness of a cap layer, which magnetically separates the magnetic domain control layer and a shield, magnetic field leakage to the shield may become a problem due to the cap layer being too thin.

Furthermore, the magnetic domain control layer is formed along the end face of a sensor film which is normally refined, where the element end face is usually an oblique face with respect to the sensor film in order to a prevent drop in output due to electrical shunting. This means that the magnetic domain control layer is tapered toward the shield, and this leads to a situation in which the magnetic field does not enter the free layer as readily because of the effect of shape anisotropy.

In one exemplary embodiment, a field intensity of the magnetic domain control film applied to the sensor film free layer and the shield was calculated using the finite element method. For the read element shapes used in the calculation, the element shape of a current head with a track width (Twr) of 35 nm and a shield-to-shield gap (Gs) of 30 nm, the shield shape, and the magnetic domain control film shape were estimated. Furthermore, actual measurements were used for the magnetic parameters of the magnetic domain control film. It should be noted that the dimensions used in this embodiment are not meant to limit the scope of the invention, but rather to describe the present exemplary embodiment.

In accordance with the present exemplary embodiment, the magnetic domain control film was constructed using a perpendicular anisotropy film and an in-plane anisotropy film formed in succession in a direction away from the sensor film edge, and the magnetic field distribution was calculated. The thickness ratio of the perpendicular anisotropy film and the in-plane anisotropy film was set at 1:4, respectively.

Table 1 shows the magnetic fields applied to the free layer by various magnetic domain control films comprising an in-plane anisotropy film and in-plane/perpendicular anisotropy films. The magnetic field in this case is shown as the average magnetic field applied to the free layer edge and the free layer as a whole. The maximum magnetic field applied to the shield is also shown.

TABLE 1

|  | Coercive Field of Perpendicular Anisotropy Film | Magnetic Field at Edge of Free Layer | Average Magnetic Field into Free Layer | Maximum Magnetic Field into USL |
| --- | --- | --- | --- | --- |
| Standard | — | 2438 | 1139 | 8179 |
| In-plane/Perp. | 1500 Oe | 1986 | 944 | 6824 |
| In-plane/Perp. | 3000 Oe | 2452 | 1173 | 7610 |
| In-plane/Perp. | 4500 Oe | 2691 | 1281 | 7352 |
| In-plane/Perp. | 10,500 Oe | 3398 | 1603 | 6265 |

For the calculations corresponding to the present exemplary embodiment, a measured value of 1500 Oe was used for the coercive force of the in-plane anisotropy film, and the coercive force of the perpendicular anisotropy film was varied between 1500 and 10,500 Oe. The easy magnetic domain of a perpendicular anisotropy film is normally limited to the two directions perpendicular to a plane of formation thereof. Therefore, the perpendicular anisotropy may be described as having a higher anisotropy than the in-plane anisotropy film, in one approach. This may be caused by the dispersed anisotropy, or higher coercive force of the in-plane anisotropy, but these theories are not meant to be limiting on the invention in any way, whatever the cause.

Figure 5A:
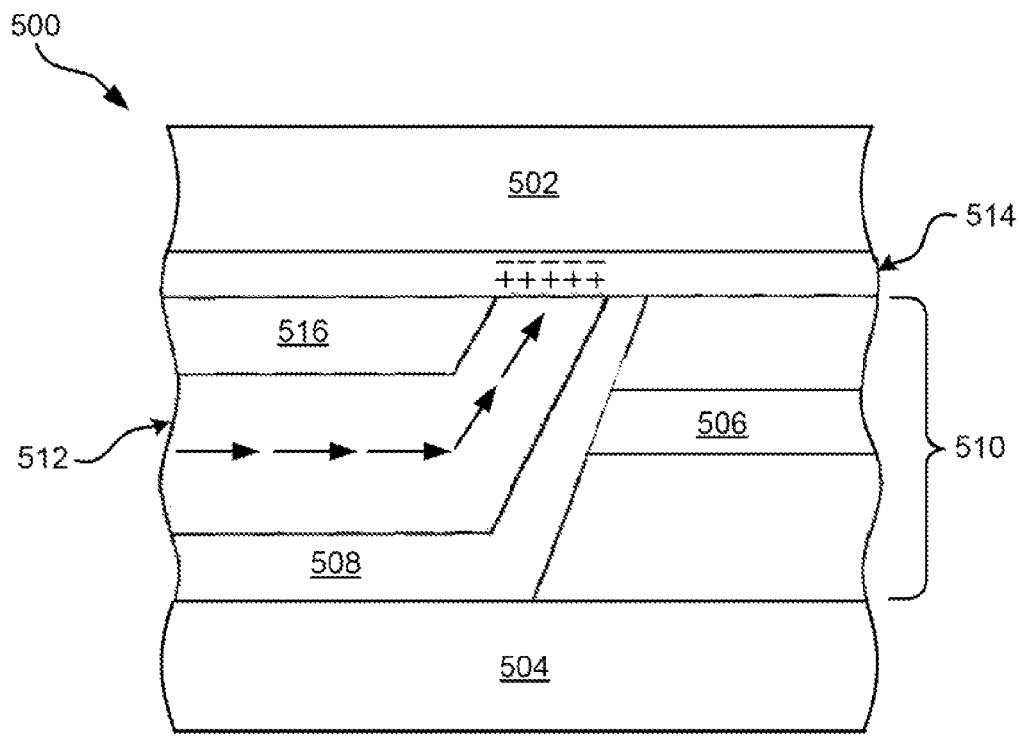
FIG. 5A shows a partial air-bearing surface (ABS) view of a magnetic head according to the prior art.

It should be noted that "standard" denotes a comparative example based on a standard magnetic head in which the magnetic domain control film comprises a single in-plane anisotropy layer, as shown in FIG. 5A, which is a partial ABS view of a magnetic head 500. The magnetic head 500 comprises a sensor stack 510 of a type known in the art such as magnetoresistive (MR), giant magnetoresistive (GMR), anisotropic magnetoresistive (AMR), tunneling magnetoresistive (TMR), etc., the sensor stack 510 including a free layer 506. The magnetic head 500 also includes a seed layer 508, an in-plane anisotropy film 512, and non-magnetic separation layers 514, 516. Furthermore, an upper shield layer (USL) 502 and a lower shield layer (LSL) 504 are positioned on either sides of the structure, according to one embodiment.

Figure 5B:
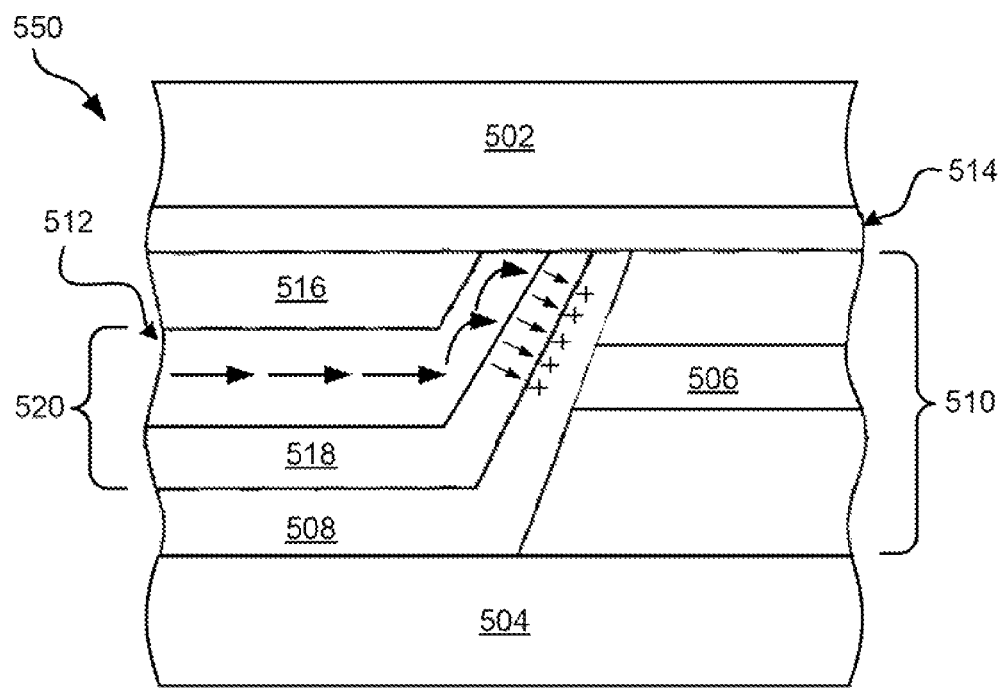
FIG. 5B shows a partial ABS view of a magnetic head according to one embodiment.

Now referring to FIG. 5B, a partial ABS view of a magnetic head 550 according to one embodiment is shown. This magnetic head 550 is similar to the prior art magnetic head (500, FIG. 5A) except that it includes a layered hard bias layer 520 that includes an in-plane anisotropy film 512 above a perpendicular anisotropy film 518. A magnetic field applied to the free layer 506 increases together with the coercive force of the perpendicular anisotropy film 518. Consequently, it can be seen from Table 1 that when the coercive force of the perpendicular anisotropy film 518 is 3 kOe or greater, it is possible to apply a magnetic field to the free layer 506 more strongly than with a standard in-plane anisotropy film 512 alone, as shown in FIG. 5A.

Furthermore, when the anisotropic magnetic field of the perpendicular anisotropy film of the magnetic head in the exemplary embodiment (550, FIG. 5B) was set at 10,500 Oe, an improvement of at least 30% was seen in comparison with the standard magnetic head (500, FIG. 5A). Without being bound to any theory, it is strongly believed that a magnetic field may be more effectively applied by adopting the layered structure with the perpendicular anisotropy film of the exemplary embodiment, compared with the standard magnetic head where the magnetic domain control film comprises only the in-plane anisotropy film.

Referring to FIG. 5B, in one embodiment, a magnetic head 550 comprises a lower shield layer 504, a sensor stack 510 positioned above the lower shield layer, the sensor stack comprising a free layer 506, a layered hard bias magnet 520 positioned above the lower shield layer and aligned with both sides of the sensor stack in a track width direction, the hard bias magnet comprising a perpendicular anisotropy film 518 positioned above the lower shield layer and aligned with both sides of the sensor stack in the track width direction (e.g., it is positioned above the lower shield layer, and it is positioned on the angled sides of the sensor stack).

In some approaches, the magnetic head may include one or more intervening layers between the lower shield layer and the perpendicular anisotropy film, such as a seed layer or any other layer as would be understood by one of skill in the art upon reading the present descriptions). The perpendicular anisotropy film directs magnetic fields in a direction perpendicular to planes of formation thereof (and any number of planes of formation are possible, such as a flat plane above the lower shield layer and an angled plane on sides of the sensor stack, according to one embodiment). The magnetic head also includes an in-plane anisotropy film 512 positioned above the perpendicular anisotropy film, wherein the in-plane anisotropy film directs magnetic fields in a direction of planes of formation thereof (any number of planes of formation are possible, such as a flat plane above the lower shield layer and an angled plane on sides of the sensor stack, in one embodiment). The magnetic head also comprises an upper shield layer 502 positioned above the hard bias magnet and the sensor stack:

According to several embodiments, a thickness of the layered hard bias magnet may be in a range between about 5 nm and 20 nm, an anisotropy of the in-plane anisotropy film may be less than an anisotropy of the perpendicular anisotropy film, such as a situation where the anisotropy of the perpendicular anisotropy film is more than about twice the anisotropy of the in-plane anisotropy film, the sensor stack may be a CPP type sensor, the in-plane anisotropy film may be magnetically coupled to the perpendicular anisotropy film, surfaces of the layered hard bias magnet facing either side of the sensor stack may be oblique with respect to the sensor stack (e.g., the intersection between the sensor stack and the layered hard bias magnet are not perpendicular to planes of formation thereof), etc.

In more embodiments, a track width of the magnetic head may be in a range between about 15 nm and about 40 nm, a distance from an upper surface of the lower shield layer and a lower surface of the upper shield layer (shield-to-shield gap Gs) may be in a range between about 18 nm and about 30 nm, the in-plane anisotropy film may comprise CoPt, etc.

According to one embodiment, the magnetic head may further comprise a seed layer positioned below the hard bias magnet and above the lower shield layer and aligned with at least a portion of sides of the sensor stack in a track width direction. The seed layer may comprise a material having a high Ku, as described herein.

In practice, a coercive force of about 10 kOe or greater has been achieved with a CoPt in-plane anisotropy film with a perpendicular film at about 1.5-2 kOe, according to one embodiment. Therefore, without wishing to be bound by any theory, it is believed possible to anticipate that a more effective magnetic field will be applied with this kind of magnetic domain control film having a layered structure.

Table 1 also shows the maximum magnetic field applied to the upper shield layer (502, FIG. 5B), where, according to the exemplary embodiment, the greater the leaked magnetic field to the shield, the magnetically harder the shield becomes, causing resolution deterioration, which is undesirable.

The leaked magnetic field of the standard magnetic head (500, FIG. 5A), comprising the in-plane anisotropy, may be reduced by about 10%-20% when compared to a structure comprising a shield having a magnetic domain control film which has a layered structure and a perpendicular anisotropy film. Therefore, without wishing to be bound by any theory, it is believed that improved resolution may be anticipated as a result of the embodiments described herein.

Referring again to FIG. 5B, in one embodiment, a magnetic head 550 comprises a layered hard bias magnet 520 comprising a perpendicular anisotropy film 518 to which magnetic anisotropy is introduced perpendicular to an edge in a track width direction of the free layer 506, and an in-plane anisotropy film 512 positioned above the perpendicular anisotropy film 518.

Additionally, a seed layer 508 comprising one or more high magnetocrystalline anisotropy (Ku) materials may be positioned below the hard bias magnet layers 520. By high Ku, what is meant is that the materials have as high of a Ku as possible, such as a Ku of about $6\times10^6$ ergs/cm$^3$, $8\times10^6$ ergs/cm$^3$, $1\times10^7$ ergs/cm$^3$, $1.2\times10^7$ ergs/cm$^3$, or greater.

The layered hard bias magnet 520 may comprise CoCrPt, CoPt, etc., as would be understood by one of skill in the art. The high Ku materials that comprise the seed layer 508 are strongly stabilized on an external magnetic field, such as but not limited to, a magnetic field of a hard disk drive medium, leading to stabilization of head performance.

Without wishing to be bound to any theory, it is thus believed possible to increase the magnetic field applied to the free layer 506 by combining the in-plane/perpendicular anisotropy films into a layered hard bias magnet 520. Furthermore, it is believed that the strong anisotropy in one direction of the perpendicular anisotropy film 518 makes it possible to reduce the leakage magnetic field to the upper shield layer 502 while also increasing the magnetic field applied. This embodiment is shown schematically in FIG. 5B which shows a partial ABS view of a magnetic head 550. The magnetic head 550 comprises a sensor stack 510 which includes a free layer 506, a seed layer 508 positioned aligned with at least a portion of the sensor stack 510, an upper shield layer 502 positioned above the sensor stack 510, and a lower shield layer 504 positioned below the sensor stack 510.

According to the embodiment depicted in FIG. 5B, by utilizing the hard bias magnet 520, which comprises the perpendicular anisotropy film 518 and the in-plane anisotropy film 512, it is possible to suppress generation of a magnetic charge at an USL 502 due to coupling, between the perpendicular anisotropy film 518 and the in-plane anisotropy film 512 hard magnets. The charge makes a magnetic domain structure in the USL 502, which makes the permeability of the USL 502 decrease. When the in-plane anisotropy film 512 and the perpendicular anisotropy film 518 are combined, it is possible to forcibly tilt the magnetization of the in-plane anisotropy film 512 toward the free layer 506, particularly at an edge of the sensor stack 510. This allows for a reduction in the leakage magnetic field to the USL 502 while also allowing a strong magnetic field to enter the free layer 506.

On the other hand, for a standard magnetic head 500 as shown in a partial ABS view in FIG. 5A, the in-plane anisotropy film 512 is formed along the slope at the edge of the sensor stack 510, and therefore most of the magnetic field is unfavorably oriented toward the USL 502.

In a second exemplary embodiment, the film thickness ratio in the magnetic domain control film comprising the in-plane/perpendicular anisotropy films was changed in order to evaluate the magnetic field distribution. Table 2 shows the corresponding average magnetic field applied to the edge of the free layer, the free layer as a whole, and the maximum leakage magnetic field to the USL. Table 2 also depicts the relationship between the thickness ratio of perpendicular anisotropy film and the in-plane anisotropy film.

TABLE 2

|  | Film Thickness Ratio | Magnetic Field at Edge of Free Layer | Average Magnetic Field into Free Layer | Maximum Magnetic Field into USL |
|---|---|---|---|---|
| Standard | — | 2438 | 1139 | 8179 |
| In-plane/Perp. | 20% | 2452 | 1173 | 7610 |
| In-plane/Perp. | 40% | 2280 | 1086 | 6124 |
| In-plane/Perp. | 60% | 2104 | 1025 | 5359 |

In the second exemplary embodiment, a measured value of 1500 Oe was used for the coercive force of the in-plane anisotropy film, and 3000 Oe was used for the coercive force of the perpendicular anisotropy film. When the ratio of the thickness of the perpendicular anisotropy film with respect to the total thickness of the magnetic domain control film was around 20% and the coercive force of the perpendicular anisotropy film was twice that of the in-plane anisotropy film, the magnetic field applied to the free layer was higher than in a standard magnetic head. Furthermore, when the film thickness ratio was further increased, the applied magnetic field decreased. On the other hand, the leakage magnetic field to the USL decreased in response to any increase in the film thickness ratio of the perpendicular anisotropy film.

Table 3 shows the results of a third exemplary embodiment having a similar structure to the second exemplary embodiment corresponding to Table 2; however, the coercive force of the perpendicular anisotropy film was set at 10,500 Oe. Table 3 also depicts the relationship between the thickness ratio of perpendicular anisotropy film and the in-plane anisotropy film. Furthermore, the relationship between the average magnetic field and the magnetic field at the edge applied to the free layer is shown, along with the maximum magnetic field applied to the shield.

TABLE 3

|  | Film Thickness Ratio | Magnetic Field at Edge of Free Layer | Average Magnetic Field into Free Layer | Maximum Magnetic Field into USL |
|---|---|---|---|---|
| Standard | — | 2438 | 1139 | 8179 |
| In-plane/Perp. | 20% | 3398 | 1603 | 6265 |
| In-plane/Perp. | 40% | 3878 | 1782 | 4437 |
| In-plane/Perp. | 60% | 3385 | 1632 | 6164 |
| In-plane/Perp | 100% | 5046 | 2375 | 11629 |

In the third exemplary embodiment, as demonstrated in Table 3, the magnetic field applied to the free layer increased together with the film thickness ratio of the perpendicular anisotropy film and the magnetic field applied to the free layer peaked when the film thickness ratio was 40%. Meanwhile, when examining the leakage magnetic field to the shield, it is apparent that the minimum value was achieved when the film thickness ratio of the in-plane/perpendicular anisotropy films was 40%. Table 3 depicts that the highest applied magnetic field was obtained when the magnetic domain control film comprised the perpendicular anisotropy film, although the leakage magnetic field to the upper shield was around 40% higher than with the standard magnetic head. The magnitude of the magnetic field applied to the free layer and the shield varied according to what kind of magnetization the magnetic domain control film possessed in the region of the element edge.

Furthermore, one advantage of the layered hard bias magnet comprising the in-plane/perpendicular anisotropy films lies in the fact that the magnetic field is directed toward the free layer due to high anisotropy, without causing the magnetic field to leak toward the USL.

The perpendicular anisotropy film may be formed as a superlattice in which (Co/Pt), (Co/Ni), etc., are stacked in atomic order. When this superlattice perpendicular anisotropy film is used as the perpendicular anisotropy film in the magnetic domain control film (hard bias magnet layer), it is possible to apply the magnetic field more effectively. This may be accomplished due to the period of the superlattice varying at the edge of the structure (element edge), and the base section away from the edge, due to the shadow effect of the structure. The anisotropic energy (in this case corresponding to the coercive force) of the superlattice perpendicular anisotropy film varies at the period of the film thickness. When the perpendicular film is formed with a period such that the anisotropic energy increases at the element edge, the period is extended at the base part, so the anisotropic energy is reduced.

Table 4 shows the results of a fourth exemplary embodiment where the magnetic field was applied to the edge of the free layer. In this exemplary embodiment, the coercive force of the perpendicular anisotropy film was 10,500 Oe at the element edge and steadily changed as far as the base part up to 1500 Oe (in a gradient). The maximum magnetic field applied to the shield is also shown.

TABLE 4

|  | Film Thickness Ratio | Magnetic Field at Edge of Free Layer | Average Magnetic Field into Free Layer | Maximum Magnetic Field into USL |
|---|---|---|---|---|
| Standard | — | 2438 | 1139 | 8179 |
| In-plane/Perp. | 20% | 3398 | 1603 | 6265 |
| In-plane/Perp. | 20% gradient | 3647 | 1656 | 6865 |
| In-plane/Perp. | 40% | 3878 | 1782 | 4437 |
| In-plane/Perp | 40% gradient | 4230 | 1861 | 6247 |

Here, the film thickness ratio of the perpendicular anisotropy film was assumed to be 20% and 40%, respectively. With either film thickness ratio, the magnetic field applied to the free layer could be increased, suggesting that the magnetization at the base part of the magnetic domain control film was directed more toward the free layer. Without wishing to be bound to any theory, it is believed that in this arrangement, the coercive force at the base part of the perpendicular anisotropy film is small. Therefore the perpendicular anisotropy film and the in-plane anisotropy film are magnetically coupled, resulting in the magnetization of the component oriented toward the free layer being increased, whereby the magnetic field applied to the free layer is increased. On the other hand, although the leakage magnetic field to the USL is greater when a coercive force gradient is not considered, the leakage magnetic field can still be reduced by around about 20% compared with the standard magnetic head comprising only the in-plane anisotropy film.

It is believed, from the above results, that when the perpendicular anisotropy film and the in-plane anisotropy film are stacked and the thickness ratio thereof is set in a range between about 15% and about 50%, such as between about 20% and about 40%, a stronger applied magnetic field is imparted to the free layer than in a standard magnetic head comprising an in-plane anisotropy film; while at the same time the leakage magnetic field to the upper shield may be reduced. This suggests that embodiments described herein in which a perpendicular anisotropy film and an in-plane anisotropy film are stacked makes it possible to produce a magnetic domain control film in which the applied magnetic field imparted to the free layer is comparable to that of a standard magnetic head, while at the same time, the magnetic domain control film is thinner than a standard magnetic domain control film.

The film thickness dependency of the magnetic domain control film was investigated in two tested magnetic heads, according to different embodiments, in which the coercive force of the perpendicular anisotropy film was set at 3000 Oe and 10,500 Oe. Tables 5 and 6 show the respective results of these two tested embodiments.

Table 5 depicts the results of the tested embodiment where a magnetic domain control film thickness depends on the magnetic field applied to the free layer edge and average magnetic field, in a magnetic domain control film comprising in-plane and perpendicular anisotropy films. The maximum magnetic field applied to the USL is also shown where the coercive force of the perpendicular anisotropy film was set at 3000 Oe, and the film thickness ratio was 20%. Thickness of HB indicates the thickness of the domain control film in relation to the thickness of a standard domain control film, also referred to as a hard bias (HB) magnet layer.

TABLE 5

|  | Thickness of HB | Magnetic Field at Edge of Free Layer | Average Magnetic Field into Free Layer | Maximum Magnetic Field into USL |
| --- | --- | --- | --- | --- |
| Standard | 100% | 2438 | 1139 | 8179 |
| In-plane/Perp. | 100% | 2452 | 1173 | 7610 |
| In-plane/Perp. | 90% | 2634 | 1214 | 5177 |
| In-plane/Perp. | 80% | 2689 | 1203 | 3900 |
| In-plane/Perp. | 70% | 2739 | 1160 | 2966 |
| In-plane/Perp. | 60% | 2398 | 1000 | 2161 |

Table 6 depicts the results of the tested embodiment where a magnetic domain control film thickness depends on the magnetic field applied to the free layer edge and average magnetic field, in a magnetic domain control film comprising in-plane and perpendicular anisotropy films. The maximum magnetic field applied to the shield is also shown where the coercive force of the perpendicular anisotropy film was set at 10,500 Oe, and the film thickness ratio was 20%.

TABLE 6

|  | Thickness of HB | Magnetic Field at Edge of Free Layer | Average Magnetic Field into Free Layer | Maximum Magnetic Field into USL |
| --- | --- | --- | --- | --- |
| Standard | 100% | 2438 | 1139 | 8179 |
| In-plane/Perp. | 100% | 3398 | 1603 | 6265 |
| In-plane/Perp. | 90% | 3426 | 1553 | 4599 |
| In-plane/Perp. | 80% | 3406 | 1505 | 3393 |
| In-plane/Perp | 70% | 3386 | 1391 | 2765 |
| In-plane/Perp | 60% | 2735 | 1137 | 2011 |

Here, the thickness of the perpendicular anisotropy film was fixed at 20% of the magnetic domain control film as a whole. When the thickness of the magnetic domain control film comprising the in-plane/perpendicular anisotropy films was reduced to 90% and 80% of the standard film thickness, the magnetic field applied to the free layer increased at one time and then decreased. Since the leakage magnetic field to the shield decreased as the magnetic domain control film became thinner, this suggested that with greater thinning, the magnetic field could be applied to the free layer in a more efficient manner.

Furthermore, without being bound by any particular theory, according to one hypothesis, the reduction in the magnetic field when the film thickness was reduced may have occurred because the volume of the magnetic domain control film decreased. The thickness of the magnetic domain control film which imparts an applied magnetic field comparable to that of a standard embodiment may be considerably reduced to around 60%-70% the thickness of a standard film with the coercive force in either case. At the same time, the leakage magnetic field to the upper shield could also be considerably reduced compared with a standard embodiment.

When a magnetic domain control film having such a layered structure comprising in-plane/perpendicular anisotropy films is used, it is possible to make the magnetic domain control film thinner, which is useful for gap narrowing, and the leakage magnetic field to the USL may also be reduced. As a result, it is possible to prevent a drop in resolution due to reduced permeability of the shield. Furthermore, the cap layer may also be made thinner as the magnetic domain control film becomes thinner, and this leads to improved resolution.

Figure 6:
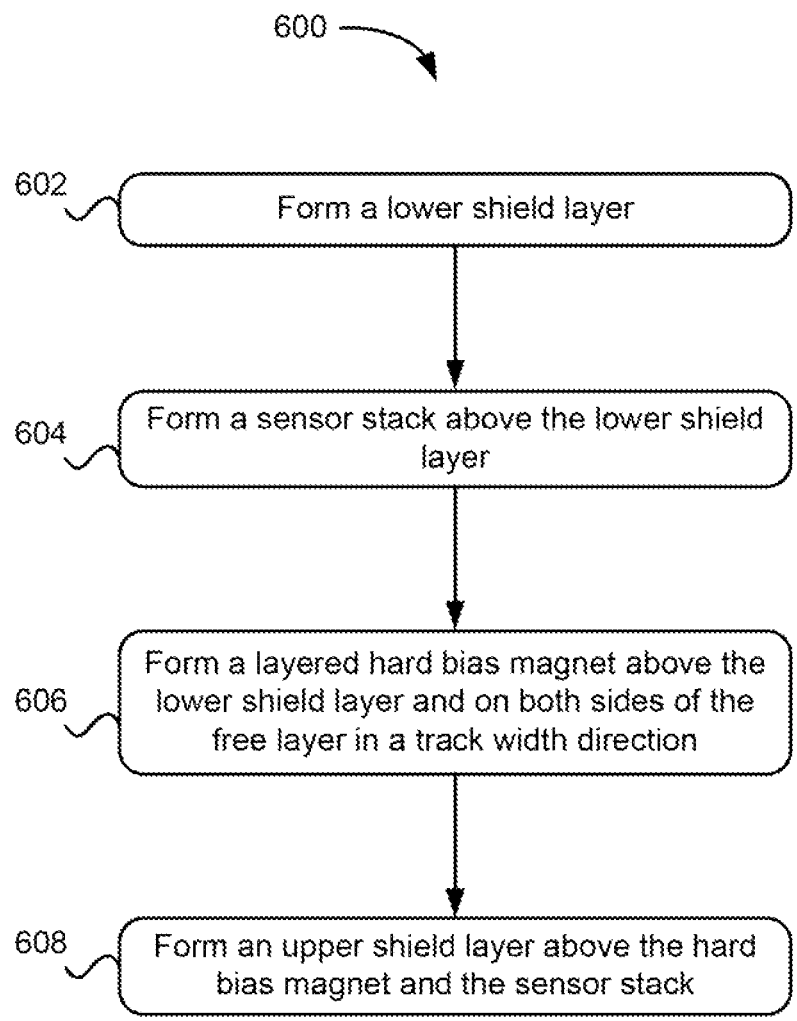
FIG. 6 is a flowchart of a method, according to one embodiment.

Referring now to FIG. 6, a method 600 is shown, according to one embodiment. The method 600 may be performed in any desired environment, including those shown in FIGS. 1-5, among others. In addition, the method 600 may involve more or less operations than depicted in FIG. 6, as would be understood by one having ordinary skill in the art upon reading the present descriptions.

In one approach, the method 600 for forming a magnetic head as disclosed in the present descriptions may be summarized in four operations. In one approach, the method 600 includes forming a lower shield layer in operation 602, and forming a sensor stack above the lower shield layer in subsequent operation 604.

In a further approach, and in particular contrast to the prior art, the method 600 also includes forming a layered hard bias magnet above the lower shield layer and on both sides of the free layer in a track width direction in operation 606. Moreover, magnetic heads formed using the exemplary method of FIG. 6 are characterized as having a portion of the layered hard bias magnet facing toward the free layer that has perpendicular anisotropy in that it directs magnetic fields in a direction perpendicular to the plane of film formation, e.g., toward the sides of the free layer.

Furthermore, in operation 608, the method 600 additionally includes forming an upper shield layer above the layered hard bias magnet and the sensor stack, according to still another approach.

In additional embodiments, forming a magnetic head with a layered hard bias magnet according to the present descriptions may further include additional operations. For example, in one approach, forming the layered hard bias magnet may include forming a perpendicular anisotropy film above the lower shield layer and aligned with both sides of the sensor stack in a track width direction (e.g., it is formed on either side of the sensor stack) and may include intermediary layers therebetween, such as a seed layer, or any other layer as would be understood by one of skill in the art upon reading the present descriptions. Moreover, as a result of this formation, the perpendicular anisotropy film directs magnetic fields in a direction perpendicular its planes of formation, and when formed on sides of the sensor stack, it directs magnetic fields toward the sensor stack.

In further embodiments, forming a magnetic head with a layered hard bias magnet may include forming an in-plane anisotropy film above the perpendicular anisotropy film. In such an arrangement the in-plane anisotropy film directs magnetic fields in the direction of the planes in which the in-plane anisotropy film was formed. Moreover, in one embodiment, the in-plane anisotropy film may be magnetically coupled to the perpendicular anisotropy film.

In any of the above described embodiments, the magnetic head may be further characterized as having a thickness ratio (defined as a thickness of the perpendicular anisotropy film divided by a thickness of the in-plane anisotropy film) between about 20% and about 40%. Furthermore, the anisotropy of the in-plane anisotropy film may preferably be less than the anisotropy of the perpendicular anisotropy film.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head; comprising:
   a lower shield layer;
   a sensor stack positioned above the lower shield layer, the sensor stack comprising a free layer;
   a layered hard bias magnet positioned above the lower shield layer and on both sides of the sensor stack in a track width direction, the hard bias magnet comprising:
      a perpendicular anisotropy film positioned above the lower shield layer and aligned with both sides of the sensor stack in the track width direction, wherein the perpendicular anisotropy film directs magnetic fields in a direction perpendicular to planes of formation thereof, and
      an in-plane anisotropy film positioned above the perpendicular anisotropy film, wherein the in-plane anisotropy film directs magnetic fields in a direction of planes of formation thereof; and
   an upper shield layer positioned above the hard bias magnet and the sensor stack.

2. The magnetic head as recited in claim 1, wherein a thickness ratio, defined as a thickness of the perpendicular anisotropy film divided by a thickness of the in-plane anisotropy film expressed in percentage, is between about 15% and about 50%.

3. The magnetic head as recited in claim 2, wherein the thickness ratio is between about 20% and about 40%.

4. The magnetic head as recited in claim 1, wherein a thickness of the layered hard bias magnet is in a range between about 5 nm and 20 nm.

5. The magnetic head as recited in claim 1, wherein an anisotropy of the in-plane anisotropy film is less than an anisotropy of the perpendicular anisotropy film.

6. The magnetic head as recited in claim 5, wherein the anisotropy of the perpendicular anisotropy film is more than about twice the anisotropy of the in-plane anisotropy film.

7. The magnetic head as recited in claim 1, wherein the sensor stack is a current perpendicular-to-plane (CPP) type sensor.

8. The magnetic head as recited in claim 1, wherein the in-plane anisotropy film is magnetically coupled to the perpendicular anisotropy film.

9. The magnetic head as recited in claim 1, wherein suffices of the layered hard bias magnet facing either side of the sensor stack are oblique with respect to the sensor stack.

10. The magnetic head as recited in claim 1, wherein a track width of the magnetic head is in a range between about 15 nm and about 40 nm.

11. The magnetic head as recited in claim 1, wherein a distance from an upper surface of the lower shield layer and a lower surface of the upper shield layer (shield-to-shield gap) is in a range between about 18 nm and about 30 nm.

12. The magnetic head as recited in claim 1, wherein the in-plane anisotropy film comprises CoPt.

13. The magnetic head as recited in claim 1, further comprising a seed layer positioned below the hard bias magnet and above the lower shield layer and aligned with at least a portion of sides of the sensor stack in a track width direction, wherein the seed layer comprises a material having a high Ku.

14. A magnetic data storage system, comprising:
   at least one magnetic head as recited in claim
   a magnetic medium;
   a drive mechanism for passing the magnetic medium over the at least one magnetic head; and
   a controller electrically coupled to the at least one magnetic head for controlling operation of the at least one magnetic head.

15. A magnetic head, comprising:
   a lower shield layer;
   a current perpendicular-to-plane (CPP) sensor stack positioned above the lower shield layer, the sensor stack comprising a free layer:
   a layered hard bias magnet positioned above the lower shield layer and on both sides of the sensor stack in a track width direction, the hard bias magnet comprising:
      a perpendicular anisotropy film positioned above the lower shield layer and aligned with both sides of the sensor stack in the track width direction,
   wherein the perpendicular anisotropy film directs magnetic fields in a direction perpendicular to planes of formation thereof; and
      an in-plane anisotropy film positioned above the perpendicular anisotropy film, wherein the in-plane anisotropy film directs magnetic fields in a direction of planes of formation thereof; and
   an upper shield layer positioned above the hard bias magnet and the sensor stack,
   wherein a thickness ratio, defined as a thickness of the perpendicular anisotropy film divided by a thickness of the in-plane anisotropy film expressed in percentage, is between about 20% and about 40%,
   wherein an anisotropy of the in-plane anisotropy film is less than an anisotropy of the perpendicular anisotropy film.

16. The magnetic head as recited in claim 15, wherein the in-plane anisotropy film is magnetically coupled to the perpendicular anisotropy film.

17. The magnetic head as recited in claim 15, wherein surfaces of the layered hard bias magnet facing either side of the sensor stack are oblique with respect to the sensor stack.

18. The magnetic head as recited in claim 15, wherein the in-plane anisotropy film comprises CoPt.

19. A method for forming the magnetic head of claim 1, comprising:
   forming the lower shield layer;
   forming the sensor stack above the lower shield layer;
   forming the layered hard bias magnet above the lower shield layer and on both sides of the free layer in a track width direction;
   forming the upper shield layer above the hard bias magnet and the sensor stack.

20. The method as recited in claim 19, wherein forming the layered hard bias magnet comprises:
   forming the perpendicular anisotropy film above the lower shield layer and aligned with both sides of the sensor stack in the track width direction, and
   forming the in-plane anisotropy film above the perpendicular anisotropy film, wherein the in-plane anisotropy film is magnetically coupled to the perpendicular anisotropy film,
   wherein a thickness ratio, defined as a thickness of the perpendicular anisotropy film divided by a thickness of the in-plane anisotropy film expressed in percentage, is between about 20% and about 40%, and
   wherein an anisotropy of the in-plane anisotropy film is less than an anisotropy of the perpendicular anisotropy film.

* * * * *

UNITED STATES PATENT AND TRADEMARK OFFICE
CERTIFICATE OF CORRECTION

PATENT NO. : 8,451,565 B1
APPLICATION NO. : 13/301596
DATED : May 28, 2013
INVENTOR(S) : Okamura et al.

Page 1 of 1

It is certified that error appears in the above-identified patent and that said Letters Patent is hereby corrected as shown below:

In the claims:

col. 15, line 43 replace "suffices" with --surfaces--.

Signed and Sealed this
Twenty-fourth Day of September, 2013

Teresa Stanek Rea
*Deputy Director of the United States Patent and Trademark Office*